(12) United States Patent
Uemura

(10) Patent No.: US 11,489,492 B2
(45) Date of Patent: Nov. 1, 2022

(54) SEMICONDUCTOR DEVICE

(71) Applicant: RENESAS ELECTRONICS CORPORATION, Tokyo (JP)

(72) Inventor: Toshifumi Uemura, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 17/383,169

(22) Filed: Jul. 22, 2021

(65) Prior Publication Data
US 2022/0038054 A1    Feb. 3, 2022

(30) Foreign Application Priority Data

Jul. 28, 2020  (JP) ............................ JP2020-127037

(51) Int. Cl.
| | |
|---|---|
| H03B 5/04 | (2006.01) |
| H03K 3/03 | (2006.01) |
| G01R 19/165 | (2006.01) |
| G06F 1/04 | (2006.01) |
| G06F 1/28 | (2006.01) |

(52) U.S. Cl.
CPC ......... *H03B 5/04* (2013.01); *G01R 19/16552* (2013.01); *G06F 1/04* (2013.01); *G06F 1/28* (2013.01); *H03K 3/0315* (2013.01)

(58) Field of Classification Search
CPC ....................................... H03B 5/04
USPC ......................................................... 331/176
See application file for complete search history.

(56) References Cited

U.S. PATENT DOCUMENTS 10,481,185 B2   11/2019 Fukuoka et al.
2020/0089299 A1*  3/2020 Kim ........................ H03L 7/097

FOREIGN PATENT DOCUMENTS

JP           2018-055511 A      4/2018

* cited by examiner

*Primary Examiner* — Joseph Chang
(74) *Attorney, Agent, or Firm* — McDermott Will & Emery LLP

(57) ABSTRACT

A semiconductor device 1 includes: a first oscillator 11_RC1 configured to operate at a detected voltage, the first oscillator having first temperature dependency; a second oscillator 11_RC4 configured to operate at the detected voltage, the second oscillator having second temperature dependency; a count unit configured to count an output of the first oscillator and an output of the second oscillator, the output of the first oscillator and the output of the second oscillator being supplied to the count unit; an arithmetic unit configured to calculate a count value CNT (T1) of the first oscillator and a count value CNT (T4) of the second oscillator, the count values of the first and second oscillators being counted by the count unit; and a determining unit configured to compare an output of the arithmetic unit with a threshold value to output a detected result signal corresponding to a result of the comparison.

7 Claims, 11 Drawing Sheets

FIG. 3
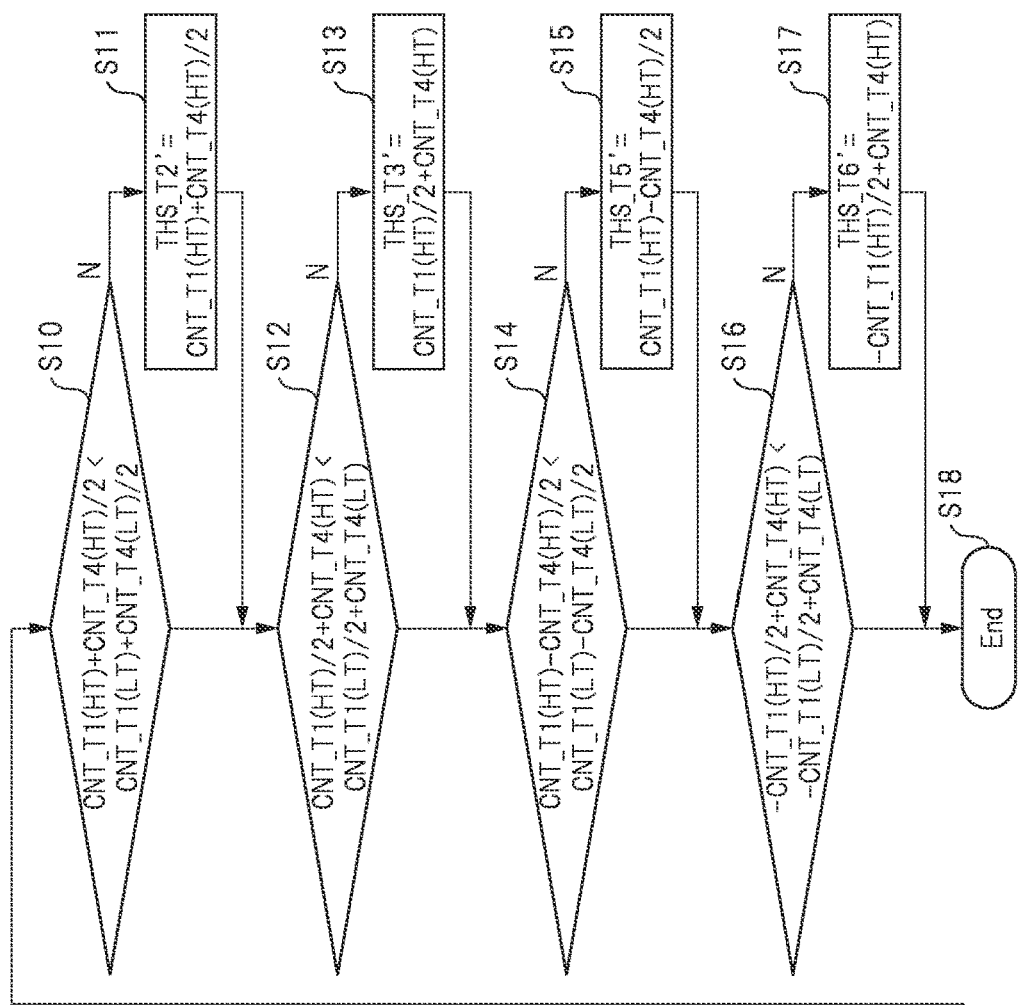
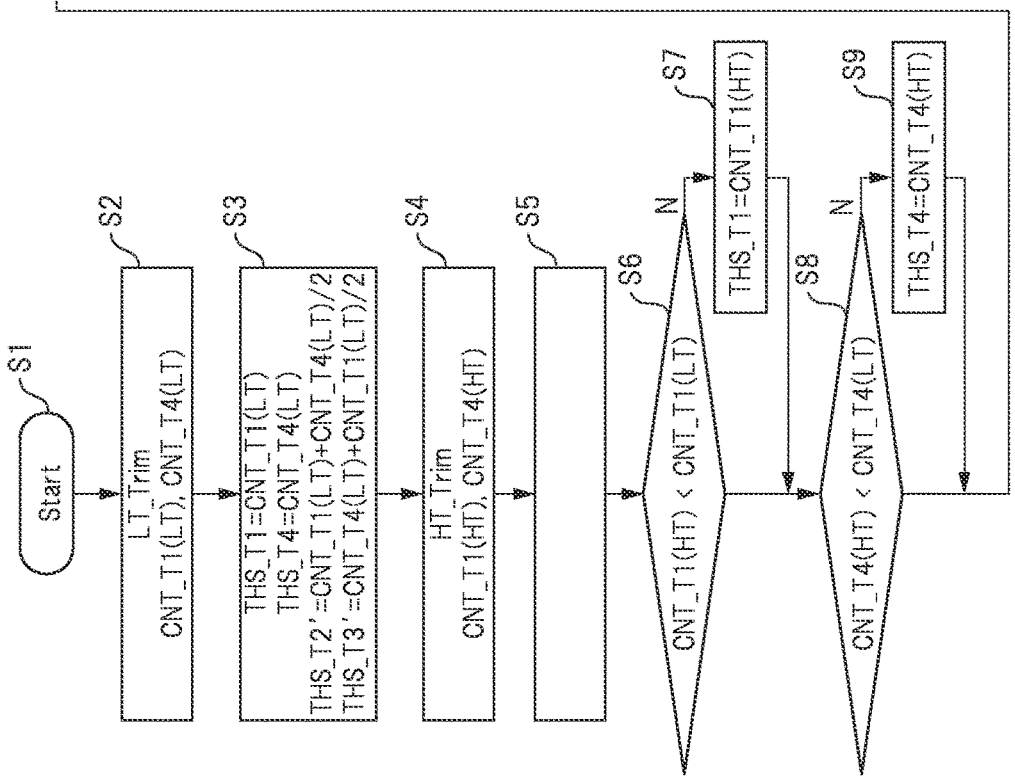

SEMICONDUCTOR DEVICE

CROSS-REFERENCE TO RELATED APPLICATIONS

The disclosure of Japanese Patent Application No. 2020-127037 filed on Jul. 28, 2020 including the specification, drawings and abstract is incorporated herein by reference in its entirety.

BACKGROUND

The present invention relates to a semiconductor device. For example, the present invention relates to a semiconductor device provided with a voltage detecting circuit configured to detect a voltage such as a power source voltage.

A voltage detecting circuit for detecting a power source voltage is described in Patent Document 1, for example. A delay monitor (12) is described as a voltage detecting circuit in FIG. 4 of Patent Document 1. The delay monitor (12) includes an oscillating unit (121) configured by ring oscillators, and a count unit (122) configured to convert frequency of the oscillating unit (121) into a digital value.

In Patent Document 1, when a target detected voltage is applied to the voltage detecting circuit, a count value obtained by the count unit (122) is set as a threshold value. In a case where the count value of the count unit (122) becomes the set threshold value or lower at the time of actual detection of voltage, it is detected that the power source voltage drops.

Since temperature drift of (temperature error) of the ring oscillator alone is usually large, Patent Document 1 describes that a ring oscillator that is the worst at low temperature and a ring oscillator that is the worst at high temperature are provided in the oscillating unit (121), and by operating the ring oscillators having different temperature dependencies at the same time, the temperature drift of the detected voltage can be reduced.

There are disclosed techniques listed below. [Patent Document 1] Japanese Unexamined Patent Application Publication No. 2018-05511

SUMMARY

Patent Document 1 describes that the temperature drift of the detected voltage can be reduced by using a plurality of ring oscillators having different temperature dependencies (hereinafter, referred to also as the "oscillators"). However, the temperature dependency of the oscillator varies depending upon a process in. manufacturing a semiconductor device and a range of the detected voltage. Therefore, it is necessary to design the oscillator in consideration of the process and the range of the detected voltage A characteristic difference between the oscillators having the different temperature dependencies usually becomes large. In order to cover this large characteristic difference, it is necessary to add and operate an oscillator that exhibits a characteristic falling between the large characteristic difference. In this case, the number of oscillators increases, and the area occupied by the oscillating unit also increases. Further, since the number of oscillators that are always in operation increases, the overhead of power consumption increases significantly. Moreover, in order to improve detection accuracy, it is required to fine-adjust the characteristic between the oscillators, but this fine adjustment is also difficult.

Further, a range of voltage that can be detected by the voltage detecting circuit is limited due to limitation of characteristics of a device constituting the oscillator and unrealistic increase in a circuit area for adjusting the temperature dependency.

A semiconductor device according to one embodiment described in the present specification is as follows Namely, a semiconductor device includes: a first oscillator configured to operate at a detected voltage, the first oscillator having first temperature dependency; a second oscillator configured to operate at the detected voltage, the second oscillator having second temperature dependency different from the first temperature dependency; a count unit configured to count an output of the first oscillator and an output of the second oscillator, the output of the first oscillator and the output of the second oscillator being supplied to the count unit; an arithmetic unit configured to calculate a count value of the first oscillator and a count value of the second oscillator, the count values of the first and second oscillators being counted y the count unit; and a determining unit configured to compare an output of the arithmetic unit with a threshold value to output a detected result signal corresponding to a result of the comparison.

The other object and new feature will become apparent from description of the present specification and the accompanying drawings.

According to one embodiment, it is possible to provide a semiconductor device including a voltage detecting circuit that can detect a voltage suitably even though a process or the like varies.

BRIEF DESCRIPTION OF THE DRAWINGS

FIG. 3 is a flowchart diagram illustrating a method of obtaining threshold values used in the semiconductor device according to the first embodiment.

DETAILED DESCRIPTION

Figure 1:
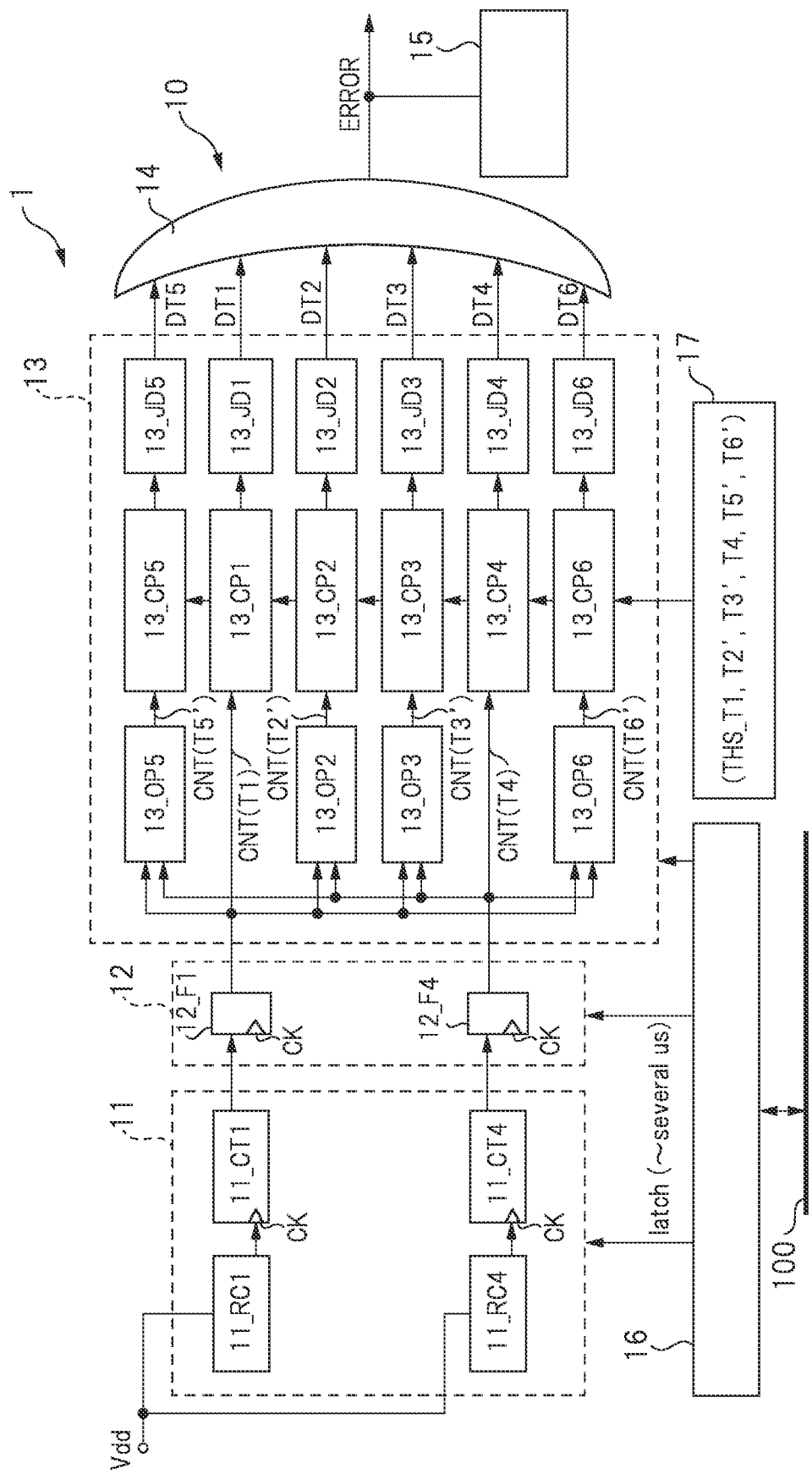
FIG. 1 is a block diagram illustrating a configuration of a semiconductor device according to a first embodiment.

Hereinafter, respective embodiments according to the present invention will be described with reference to the drawings. Note that the disclosure is just one example, and suitable modifications that can be easily conceived by a person skilled in the art without departing from the spirit of the present invention are included within the scope of the present invention as a matter of course.

Further, in this specification and the respective drawings, the same reference numerals are respectively assigned to the similar components described in the drawings, which have already been described. Detailed description thereof may be omitted appropriately.

First Embodiment (Configuration of Semiconductor Device)

FIG. 1 is a block diagram illustrating a configuration of a semiconductor device according to a first embodiment . In FIG. 1, a reference numeral 1 denotes a semiconductor device. The semiconductor device 1 includes a plurality of circuit blocks in. addition to a voltage detecting circuit. However, FIG. 1 merely illustrates a voltage detecting circuit. 10 and a bus 100 connected to the voltage detecting circuit 10, which are necessary for explanation. A, processor (not illustrated in FIG. 1) is connected to the bus 100, for example. The processor operates using a power source voltage Vdd as an operation power source. The voltage detecting circuit 10 is configured to detect an abnormality such as drop or rise of the power source volt: ge by using this power source voltage Vdd as a detected voltage.

The voltage detecting circuit 10 includes a sensor unit 11, an asynchronous transferring unit 12, an arithmetic unit 13, an OR circuit 14, a flag register 15, a control unit 16, and a trimming latch unit 17.

The sensor unit 11 includes two ring oscillators 11_RC1, 11_RC4, and two counters 11_CT1, 11_CT4 respectively corresponding to the oscillators 11_RC1, 11_CT4. The oscillator 11_RC1 and the oscillator 11_RC4 respectively have temperature dependencies that are different from each other. For convenience for explanation, the oscillator 11_RC1 is referred to as a first oscillator, and temperature dependency thereof is referred to as first temperature dependency. Further, the oscillator 11_RC4 is referred to as a second oscillator, and temperature dependency thereof is referred to as second temperature dependency. In this case, the second temperature dependency is different from the first temperature dependency. Further, the counters 11_CT1 and 11_CT4 are collectively referred to as a counter unit.

The power source voltage Vdd is supplied to each of the oscillators 11_RC1 and 11_RC4. Each of the oscillators 11_RC1 and 11_RC4 executes an oscillation operation by using the power source voltage Vdd a s an operating voltage. In the first embodiment, the power source voltage Vdd is a voltage as a detection target. (detected voltage). Frequency (the number of pulses in a predetermined time) of a clock signal formed by the oscillation operation, which is an output of each of the oscillators 11_RC1 and 11_RC4, varies in accordance with a voltage value of the power source voltage Vdd. Namely, a delay value of the clock signal outputted from each of the oscillators 11_RC1 and 11_RC4 varies in accordance with the voltage value of the power source voltage Vdd.

Since the temperature dependencies of the oscillators 11_RC2. and 11_RC4 are different from each other, a change in the delay value of the clock signal outputted from each of the oscillators 11_RC1 and 11_RC4 is different from a change in the temperature.

The output of the oscillator 11_RC1 is supplied to a clock terminal CK of the corresponding counter 11_CT1, and the output of the oscillator 11_RC4 is supplied to a clock terminal CK of the counter 11_CT4. The counters 11_CT1 and 11_CT4 are respectively configured so as to count the clock signals of the oscillators 11_RC1 and 11_RC4. As a result, in the sensor unit 11, the voltage value of the power source voltage Vdd is converted into the delay value of the clock signal, and this delay value is converted into a digital value by the counters 11_CT1, 11_CT4. The digital value formed by the sensor unit 11 is supplied to the asynchronous transferring unit 12.

The asynchronous transferring unit 12 includes flip-flop circuits 12_F1 and 12_F4 respectively corresponding to the counters 11_CT1 and 11_CT4. A latch signal is supplied from the control unit 16 to a clock terminal. CR of each of the flip-flop circuits 12_F1, 12_F4. By supplying the latch signal to the clock terminal CK, the flip-flop circuit 12_F1 takes in and holds a count value outputted from the corresponding counter 11_CT1. Similarly, the flip-flop circuit 12_F4 takes in and holds a count value outputted from the corresponding counter 11_CT4. The count value held by the flip-flop circuit 12_F1 is supplied to the arithmetic unit 13 as a count value CNT (T1) of the oscillator 11_RC1. Similarly, the count value held by the flip-flop circuit 12_F4 is supplied to the arithmetic unit 13 as a count value CNT(T4) of the oscillator 11_RC4.

Although it will be described later in detail, the arithmetic unit 13 executes calculation on the basis of the count values CNT(T1) and CNT(T4), which are outputs from the asynchronous transferring unit 12; compares a calculation result and the count values CNT(T1), CNT(T4) with threshold values; and outputs detected result signals DT1 to DT6 to the OR circuit 14. Although it is not limited particularly, in the first embodiment, in a case where the power source voltage Vdd rises more than a predetermined voltage value or descends below the predetermined voltage value (that is, in a case where the power source voltage Vdd exceeds or falls below the predetermined voltage value), at least one detected result signal of the detected result signals DT1 to DT6 becomes a logical value "1". As a result, an error signal ERROR with a logical value "1", which indicates an abnormality, is outputted from the OR circuit 14. This error signal ERROR is supplied to the flag register 15. As a result, it is possible to detect whether an abnormality occurs in the power source voltage kid or not by confirming the flag register 15.

The trimming latch unit 17 stores the threshold values used for the comparison in the arithmetic unit 13.

The control unit 16 is connected to the bus 100, and controls the sensor unit 11, the asynchronous transferring unit 12, the arithmetic unit 1, 3 and the trimming latch unit. 17 in accordance with data supplied via the bus 100.

(Configuration of Arithmetic Unit)

Next, the arithmetic unit 13 will be described. The arithmetic unit 13 includes four arithmetic circuits 13_OP2, 13_OP3, 13_OP5, and 13_OP6, six digital comparators (hereinafter, referred to also as a "comparator") 13_CP1 to 13_CP6, and six determining devices 13_JD1 to 13_JD6. The count values CNT(T1) and CNT(T4) are supplied to each of the arithmetic circuits 13_OP2, 13_OP3, 13_OP5, and 13_OP6. Each of the arithmetic circuits 13_OP2, 13_OP3, 13_OP5, and 13_OP6 executes predetermined calculation on the basis of the supplied count values, and outputs them as count values CNT(T2'), CNT(T3'), CNT (T5'), and CNT(T6').

The count value CNT(T1) is supplied to the comparator 13_CP1; the count value CNT(T2') from the arithmetic circuit 13_OP2 is supplied to the comparator 13_CP2; and the count value CNT (T3')from the arithmetic circuit. 13_OP3 is supplied to the comparator 13_CP3. Similarly, the count value CNT(T4) is supplied to the comparator 13_CP4; the count value CNT(T5') from the arithmetic circuit 13_OP5 is supplied to the comparator 13_CP5; and the count value CNT(T6') from the arithmetic circuit 13_OP6 is supplied to the comparator 13_CP6. Each of the count values CNT(T1) and CNT(T4) is obtained by counting the clock signal from the corresponding oscillator, while each of the count value CNT(T2'), the count value CNT (T3'), the count value CNT(T5'), and the count value CNT (T6')is obtained by calculation. Thus, they can also be regarded as calculation count values.

Corresponding threshold values THS_T1, THS_T2', THS_T3',

THS_T4, THS_T5', and THS_T6' are respectively supplied from the trimming latch unit 17 to the comparators 13_CP1 to 13_CP6. The comparators 13_CP1 and 13_CP2 will be described as an example. The comparator 13_CP1 compares the count value CNT(T1) with the threshold value THS_T1, and supplies a comparison result to the corresponding determining device 13_JD1. Further, the comparator 13_CP2 compares the count value CNT(T2') from the corresponding arithmetic circuit. 13_OP2 with the threshold value THS_T2', and supplies a comparison result to the corresponding determining device 13_JD2. The same applies to each of the remaining comparators 13_CP3 to 13_CP6.

The determining devices 13_JD1 to 13_JD6 respectively output the supplied comparison results as the detected result signals DT1 to DT6.

The count value CNT(T1) is based on the clock signal of the oscillator 11_RC1 that has the first temperature dependency. Therefore, the count value CNT(T1) has a first oscillator characteristic having the first temperature dependency. Similarly, the count value CNT(T4) has a fourth oscillator characteristic having the second temperature dependency.

Each of the arithmetic circuits 13_OP2, 13_OP3, 13_OP5, and 13_OP6 executes calculation with the different content from each other with respect to the count values CNT(T1) and CNT(T4). As a result, unlike the first oscillator characteristic and the fourth oscillator characteristic, the count values CNT(T2'), CNT(T3'), CNT(T5') and CNT (T6') respectively have second, third, fifth, and sixth oscillator characteristics respectively having temperature dependencies different from each other.

When a concrete example is described, the arithmetic circuit 13_OP2 executes calculation (T1+T4/2) so as to add a half of the count value CNT(T4) to the count value CNT(T1), and the arithmetic circuit 13_OP3 executes calculation (T4+T1/2) so as to add a half of the count value CNT(T1) to the count value CNT(T4). Further, the arithmetic circuit 13_OP5 executes calculation (T1−T4/2) so as to subtract the half of the count value CN(T4) from the count value CNT(T1), and the arithmetic circuit 13_OP6 executes calculation (T4−T1/2) so as to subtract the half of the count value CNT(T1) from the count value CNT(T4).

As a result, the arithmetic circuits 13_OP2 and 13_OP3 serve as arithmetic circuits (that is, a first arithmetic circuit) that execute interpolation calculation. Namely, by the interpolation, count values in the range between the count values CNT(T1) and CNT(T4) are generated as the count values CNT(T2') and CNT(T3'). Further, the arithmetic circuits 13_OP5 and 13_OP6 serve as arithmetic circuits (that is, a second arithmetic circuit) that execute extrapolation calculation. Namely, by the extrapolation, count values out of the range between the count values CNT(T1) and CNT(T4) are generated as the count values CNT(T5') and CNT(T6').

The arithmetic circuits 13_OP2, 13_OP3, 13_OP5, and 13_OP6 that execute the interpolation calculation or the extrapolation calculation can be realized by combining shift operating unit and an adder, for example. By configuring the arithmetic circuit by the shift operating unit and the adder, it is possible to suppress an increase in an occupied area of the arithmetic circuit. However, the present invention is not limited to this. Namely, the configuration of the arithmetic circuit can freely be set in accordance with target detection accuracy and the like.

In the first embodiment, the count values CNT(T1) to CNT(T6') respectively having the first to sixth oscillator characteristics whose temperature dependencies are different from each other are compared with the threshold values THS_T1 to THS_T6' and the logical value '1' indicating the abnormality is stored in the flag register 15 in a case where the power source voltage Vdd falls below or exceeds the predetermine voltage value. This makes it possible to detect the abnormality of the power source voltage Vdd.

The threshold values THS_T1 to THS_T6' described above are obtained when trimming of the voltage detecting circuit 10 or the semiconductor device i is executed, and are stored in the trimming latch unit 17. A method of obtaining the threshold values THS_T1 to THS_T6' will be described later with reference to the drawings, and detailed explanation thereof will thus be omitted herein.

The asynchronous transferring unit 12 and the arithmetic unit 13 may be operated during a period in which an output from the sensor unit 11 is compared with the threshold value. Therefore, although it is not limited particularly, the control unit 16 operates the asynchronous transferring unit 12 and the arithmetic unit 13 only during this period. This makes it possible to suppress power consumption.

The example in which the two oscillators, the four arithmetic circuits, and the six comparators are used has been described with reference to FIG. 1. However, the present invention is not limited to these numbers of components, and the numbers of components are arbitrary. Of course, each of the number of arithmetic circuits for the interpolation calculation and the number of arithmetic circuits for the extrapolation calculation is also not limited to two.

Further, the case where the arithmetic unit. 13 is provided with the arithmetic circuits, the comparators, and the determining devices has been described herein. However, it may be considered that the arithmetic unit is configured by the arithmetic circuits 13_OP2, 13_OP3, 13_OP5, 13_OP6, and the determining unit is configured by the comparators 13_CP1 to 13_CP6, the determining devices 13_JD1 to 13_JD6, and the OR circuit 14.

(Operation Example)

Figure 2:
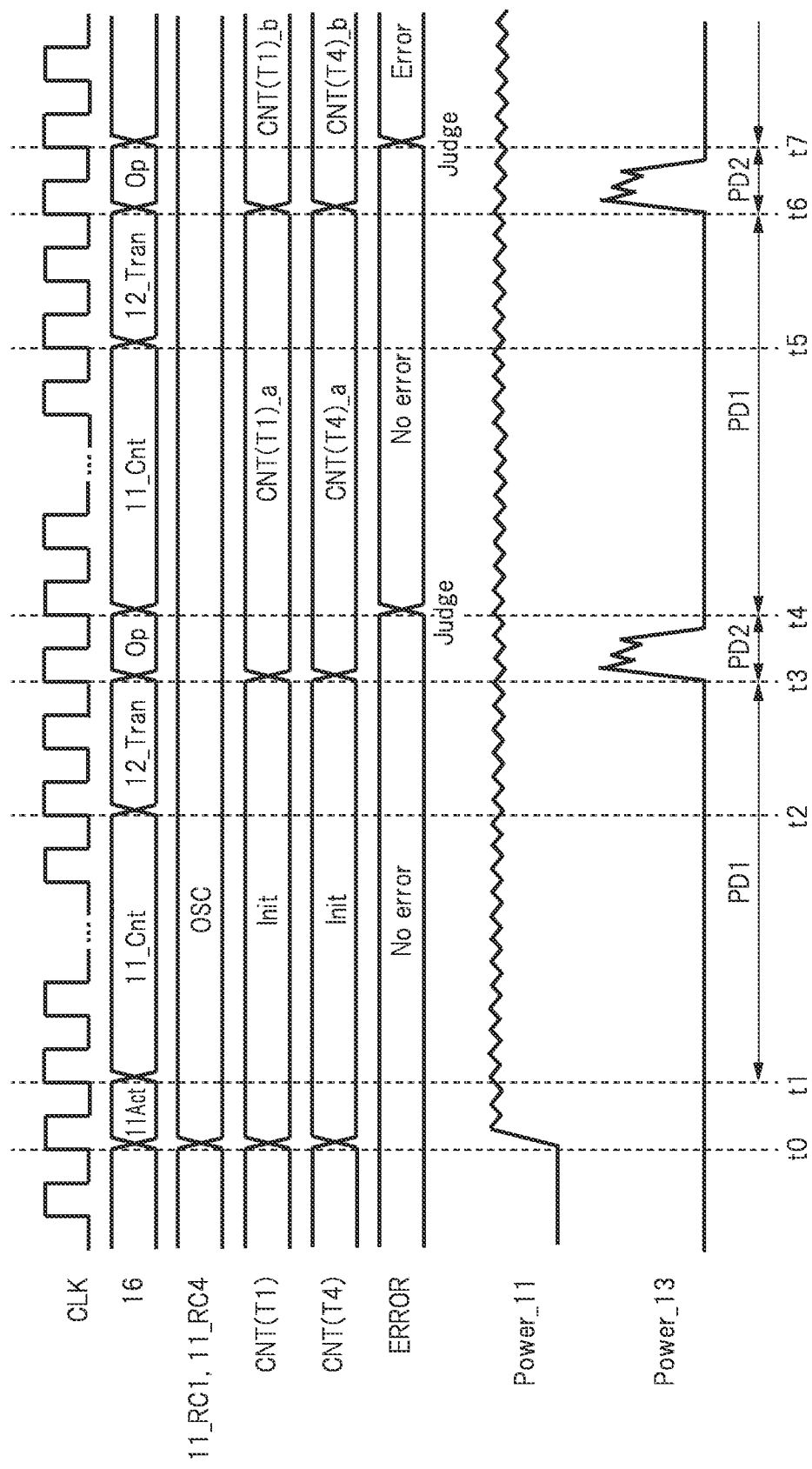
FIG. 2 is a timing chart diagram illustrating an operation of the semiconductor device according to the first embodiment.

Next, an operation example of the semiconductor device 1 illustrated in FIG. 1 will be described with reference to FIG. 1 and FIG. 2. FIG. 2 is a timing chart diagram illustrating an operation of the semiconductor device according to the first embodiment. In FIG. 2, CLK indicates a clock signal, and the voltage detecting circuit 10 operates in synchronization with the clock signal CLK.

The control unit 16 activates the sensor unit 11 at a time t0 (11_Act), Namely, the oscillators 11_RC1 and 11_RC4 are put into an oscillation (OSC) state. Further, the control unit 16 operates both the counters 11_CT1 and 11_CT4 at the same time for a period from a time t1 to a time t2 (a predetermined period). As a result, the counters 11_CT1 and 11_CT4 respectively count the number of pulses of the clock signals of the corresponding oscillators at the same time (11_Cnt).

The control unit 16 transfers the count values CNT (T1) and CNT(T4) obtained by counting to the arithmetic unit 13 by the asynchronous transferring unit 12 a period between the time t2 and a time t3 (12_Tran). Next, in a period PD2 from the time t3 to a time t4, the control unit 16 causes the arithmetic unit 13 to execute calculation, comparison, and determination (Op) Namely, during one cycle of the clock signal CLK (several tens ns), the control unit 16 causes the arithmetic circuits 13_OP2, 13_OP3, 13_OP5 and 13_OP6 to execute the calculation described above; causes the comparators 13_CP1 to 13_CP6 to execute the comparison; and causes the determining devices 13_JD1 to JD6 and the OR circuit 14 to execute the determination (Judge).

In the comparison operation, in a case where any of the count values CNT(T1) to CNT(T6') falls below or exceeds the corresponding threshold value THS_T1 to THS_T6', an error signal ERROR indicating an error is outputted from the OR circuit 14 at the time t4, and the error signal ERROR is stored in the flag register 15. Note that FIG. 2 illustrates a case where the error does not occur.

FIG. 2 illustrates an example in which the clock signal is transferred to the arithmetic unit 13 after the clock signal is counted. However, the counting and the transfer may be executed in time overlap, for example, in parallel. A period P01 from the time t1 to the time t3 is several tens μs, for example.

At the time t4, the control unit. 16 causes both the counters 11_CT1 and 11_CT4 to operate at the same time again. Since the oscillators 11_RC1 and 11_RC4 are put into the oscillation state for the period from the time t0 to the time t1, the counters 11_CT1 and 11_CT4 count the number of pulses of the clock signal from, the time t4. After that, an operation from a time t5 to a time t7 is the same as the operation from the time t2 to the time t4. Note that FIG. 2 illustrates a case where an error occurs as determination at the time t7.

Although it is not limited particularly, a register for storing error occurrence frequency, for example, may be added to the semiconductor device 1 in addition to the flag register 15. In this case, by counting the number of times of the logical value "1" stored in the flag register 15 in the predetermined period and storing the number of times in the added register by means of the processor, for example, it is possible to store the error occurrence frequency.

In FIG. 2, Power_11 indicates power consumption of the sensor unit 11, and Power_13 indicates power consumption of the arithmetic unit 13. Since the oscillators 11_RC1 and 11_RC4 oscillate after the time t0 in the sensor unit 11, power consumption is constantly generated. On the other hand, the calculation and the like may be executed in the arithmetic unit 13 at timing when the count values CNT (T1) and CNT (T4) are updated, and this causes an activation rage to become very small. Therefore, it is possible to suppress an increase in the power consumption.

(Method of Obtaining Threshold Value)

Next, a method of obtaining the threshold values stored in the trimming latch unit 17 will be described with reference to FIG. 3. FIG. 3 is a flowchart diagram illustrating a method of obtaining threshold values used in the semiconductor device according to the first embodiment.

As the threshold values TH_T1 to THS_T6', a count value obtained when the semiconductor device 1 is trimmed in a low temperature state, and a count value when the semiconductor device 1 is trimmed in a high temperature state in which temperature is higher than that in the low temperature state, and a calculation count value calculated by an external computer or the like, for example, are used.

In FIG. 3, the method of obtaining the threshold values is started at Step At Step S2, trimming of the semiconductor device (low temperature trimming: LT_Trim; is executed in the low temperature state. The count values CNT(T1) and CNT(T4) at this time are held as count values CNT_T1(LT) and CNT_T4(LT). The count values CNT_T1(LT) and CNT_T4(LT) held at Step S2 are set at Step S3 as the threshold values TNS_T1 and THS_T4 at the time of the low temperature trimming.

Further, at Step S3, the count value calculated by the external computer is set as the threshold values THS_T2' and THS_T3' at the time of the low temperature trimming. At this time, the calculation executed by the external computer is the same calculation as the calculation executed by the arithmetic circuits 13_OP2 and 13_OP3 with respect to the count value held at Step S2. Namely, the threshold values TNS_T2' and THS_T3' at the time of the low temperature trimming respectively become "CNT_T1(LT)+CNT_T4(LT)/2" and "CNT_T4(LT)+CNT_T1(LT)/2". Although it is not illustrated in FIG. 3, the same calculation as the calculation executed by the arithmetic circuits 13_OP5 and 13_OP6 is also executed by the external computer at this time. As a result, count values "CNT_T1(LT)−CNT_T4(LT)/2" and "CNT_4(LT)−CNT_T1(LT)/2" are set as the threshold values THS_T5' and THS_T6' at the time of the low temperature trimming.

At next Step S4, trimming of the semiconductor device 1 (high temperature trimming: HT_Trim) is executed in the high temperature state. The count values CNT(T1) and CNT(T4) at this time are held as count values CN_T1(HT) and CNT_T4(HT).

Next, a process at Step S5 is executed. This Step S5 is similar to Step S3. A difference is that the external computer executes calculation on the basis of the count values stored at Step S4. As a result, count values at the time of the high temperature trimming are calculated, and are set as threshold values at the time of the high temperature trimming. Namely, the count value CNT_T1(HT) is set to the threshold value THS_T1 at the time of the high temperature trimming, and the count value CNT_T4(HT) is set to the threshold value THS_T4 at the time of the high temperature trimming. Further, the calculated count values "CNT_T1(HT)+CNT_T4(HT)/2" and "CNT_T4(HT)+CNT_T1(HT)/2" are set as the threshold values THS_T2' and THS_T3' at the time of the high temperature trimming. Moreover, the calculated count values "CNT_T1(HT)−CNT_T4(HT)/2" and "CNT_T4(HT)−CNT_T1(HT)/2" are set as the threshold values THS_T5' and THS_T6' at the time of the high temperature trimming.

In a case where the power source voltage Vdd falls below the predetermined voltage value, that is, in a case where lower limit of the power source voltage Vdd is detected, a lower value of a value set as the threshold value at the time of the low temperature trimming and a value set as the threshold value at the time of the high temperature trimming is adopted as the threshold value. On the other hand, in a case where the power source voltage Vdd exceeds the predetermined voltage value, that is, in a case where an upper limit of the power source voltage Vdd is detected, a higher value of the value set as the threshold value at the time of the low temperature trimming and the value set as the threshold value at the time of the high temperature trimming is adopted as the threshold value. This adopted threshold value is stored in the trimming latch unit 17. This makes it possible to detect an abnormality of the power source voltage Vdd.

Steps S6 to S17 of FIG. 3 indicate a state when it is detected that the power source voltage Vdd exceeds the predetermined voltage value. At Steps S6 and S7, a count value with a higher value of a count value corresponding to the threshold value at the time of the low temperature trimming regarding the count value CNT(T1) and a count value corresponding to the threshold value at the time of the high temperature trimming is selected as the threshold value THS_T1. Similarly, at Steps S8 and S9, a count value with a higher value is selected as the threshold value THS_T4, and at Steps S10 and S11, a count value with a higher value is selected as the threshold value THS_T2'. Further, at Steps S12 and S13, a count value with a higher value is selected as the threshold value THS_T3'; at Steps S14 and S15, a count value with a higher value is selected as the threshold value THS_T5'; and at Steps S16 and S17, a count value with a higher value is selected as the threshold value THS_T6'. These selected threshold values are stored in the trimming latch unit 17, and the processing flow is terminated at Step S18.

The state when the situation that the power source voltage Vdd exceeds is detected has been described with respect to FIG. 3. However, by executing the processes at Steps S7, S9, S11, S13, S15, and S17 when the condition at each of Steps S6, S8, S10, S12, S14, and S16 is satisfied, it is possible to select the threshold values by which the situation that the power source voltage Vdd falls below the corresponding threshold value is detected. Further, although the case where the high temperature trimming is executed after the low temperature trimming has been described with reference to FIG. 3, the high temperature trimming may first be executed. Of course, the order of the steps for selecting the threshold value may also be different from the order illustrated in FIG. 3.

Moreover, the threshold value at the time of the low temperature trimming and the threshold value at the time of the high temperature trimming respectively set at Step S3 and Step S5 may be stored in the trimming latch unit 17. In this case, the threshold value stored in the trimming latch unit 17 may be selected in accordance with whether an exceeding state is detected or a falling below state is detected.

(Effects)

Figure 4:
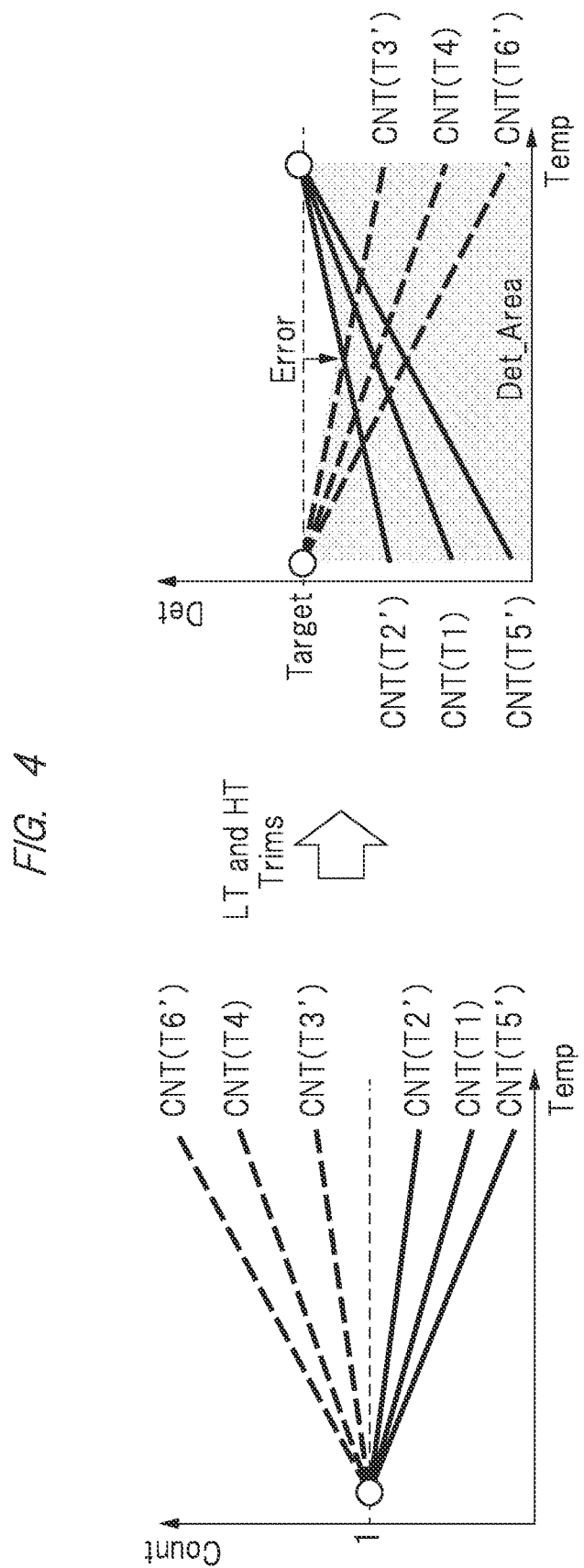
FIG. 4 is a view illustrating characteristics of a voltage detecting circuit according to the first embodiment.
Figure 5:
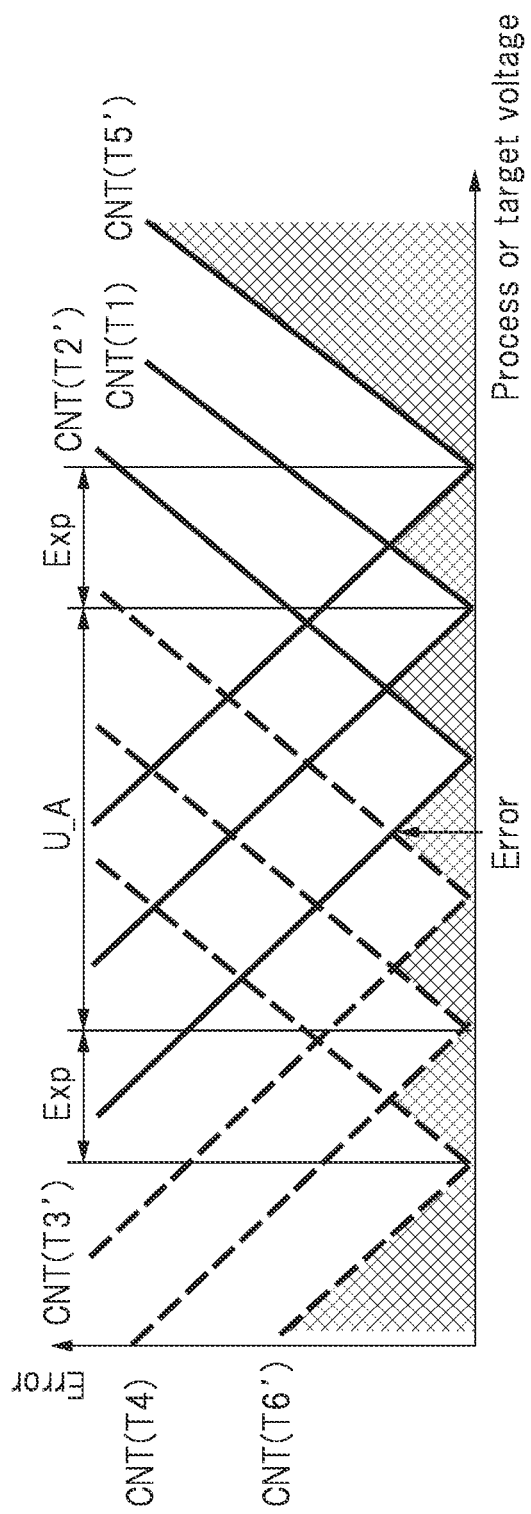
FIG. 5 is a view illustrating characteristics of the voltage detecting circuit according to the first embodiment.

In the first embodiment, on the basis of the two count values CNT(T1), CNT(T4) generated by the sensor unit 11, two types of count values CNT(T2'), CNT(T3')are generated by the interpolation calculation, and two types of the count values CNT(T5'), CNT(T6') are generated by the extrapolation calculation. FIG. 4 and FIG. 5 are views illustrating characteristics of the voltage detecting circuit according to the first embodiment. Here, FIG. 4 illustrates temperature characteristics of the generated count values and a temperature characteristic of the detected voltage, Further, FIG. 5 illustrates a process or voltage dependency of the count value, The oscillator 11_RC1 and the oscillator 11_RC4 respectively have different temperature dependencies. Therefore, when temperature rises, for example, as illustrated in FIG. 4, the count values CNT(T1), CNT(T4) vary so that the difference therebetween is increased. When temperature rises, the count values CNT(T2'), CNT(T3') generated by the interpolation calculation also vary so that the difference therebetween is increased. However, the count values CNT (T2'), CNT(T3') vary in the range between the count value CNT(T1) and the count value CNT(14). Further, with the rise in temperature, the count value CNT(T5'), CNT(T6') generated by the extrapolation calculation vary so as to spread outside the range between the count value CNT(T1) and the count values CNT(T4).

By setting the threshold values by the low temperature trimming and the high temperature trimming (LT and HT Trims) as described above, the count values CNT(T1) to CNT(T6') with respect to a target power source voltage (Target) respectively become characteristics as illustrated in a right side of FIG. 4. Here, the right side of FIG. 4 illustrates an example in which a case where the count values CNT(T1) to CNT(T6') fall below the power source voltage is detected. Further, in FIG. 4, Error indicates an error that is notified by the error signal ERROR.

In FIG. 5, a horizontal axis indicates a change in the process or the target Power source voltage. In a case where the horizontal axis is regarded as the change in the target power source voltage, a change in the horizontal axis of FIG. 5 can be regarded as a change in a range of the Power source voltage. In FIG. 5, a range of (U_A indicates a used range, and a range of Exp indicates an extended range. A range in which an abnormality can be detected by using the count values CNT(T1) to CNT(T4) is the used range U_A. The range in which an abnormality can be detected Is extended by using the count value CNT(T5'), CNT(T6') generated by the extrapolation calculation. This extended range is the extended range Exp. Since the extended ranges Exp are set to both sides of the used range U_A, in is possible to detect an abnormality even in a range of a change that exceeds a normal range of the change in the process or a normal range of the change in the power source voltage.

The count values CNT(T2') and CNT(T3') are generated by the interpolation calculation. In this case, if the interpolation is about 1 to 5 points, it is possible to realize it by only one simple adder. Therefore, possible to make the occupied area smaller compared with a case where the count values CNT(T2') and CNT(T3') are generated by the oscillators and the counters, and this makes it possible to reduce the occupied area of the voltage detecting circuit. Further, since the oscillator almost always executes the oscillation operation, power consumption is constantly generated. However, the arithmetic circuit may be activated only at the time of the calculation. This makes it possible to reduce power consumption overhead. Therefore, according to the voltage detecting circuit of the first embodiment, it is possible to reduce a detection error due to a change in temperature while suppressing the increase in the occupied area and the power consumption.

Moreover, by using the arithmetic circuits 13_OP5 and 13_OP6 that execute the extrapolation calculation, the used range U_A in which an abnormality can normally be detected can be extended. By adding the extended ranges Exp, it is possible to extend a detectable range about twice as large as the used range U_A. Normally, the both ends of the used range U_A are limited due to the characteristics of the device or the like. However, according to the first embodiment, it is possible to extend the used range easily without being limited by the characteristics of the device. Further, the arithmetic circuit that executes the extrapolation calculation can be configured only by a simple subtractor, and this makes it possible to suppress the increase in the occupied area.

Second Embodiment

In the first embodiment, the same calculation as the calculation of the arithmetic circuits 13_OP2, 13_OP3, 13_OP5, and 13_OP6 is executed at the time of the low temperature trimming and the high temperature trimming by the external computer or the like to set the threshold values.

The threshold values used in an actual detection operation can be calculated from the count values stored (and obtained) at the time of the low temperature trimming and the high temperature trimming. In a second embodiment, count values obtained at the time of low temperature trimming and high temperature trimming are stored in a semiconductor device 1, and threshold values are calculated in the semiconductor device 1 before the actual detection operation on the basis of the stored count values. Further, in the second embodiment, the content (or type) of calculation to be executed by arithmetic: circuits can be selected. Next, a semiconductor device according to the second embodiment will be described with reference to the drawings.

Figure 6:
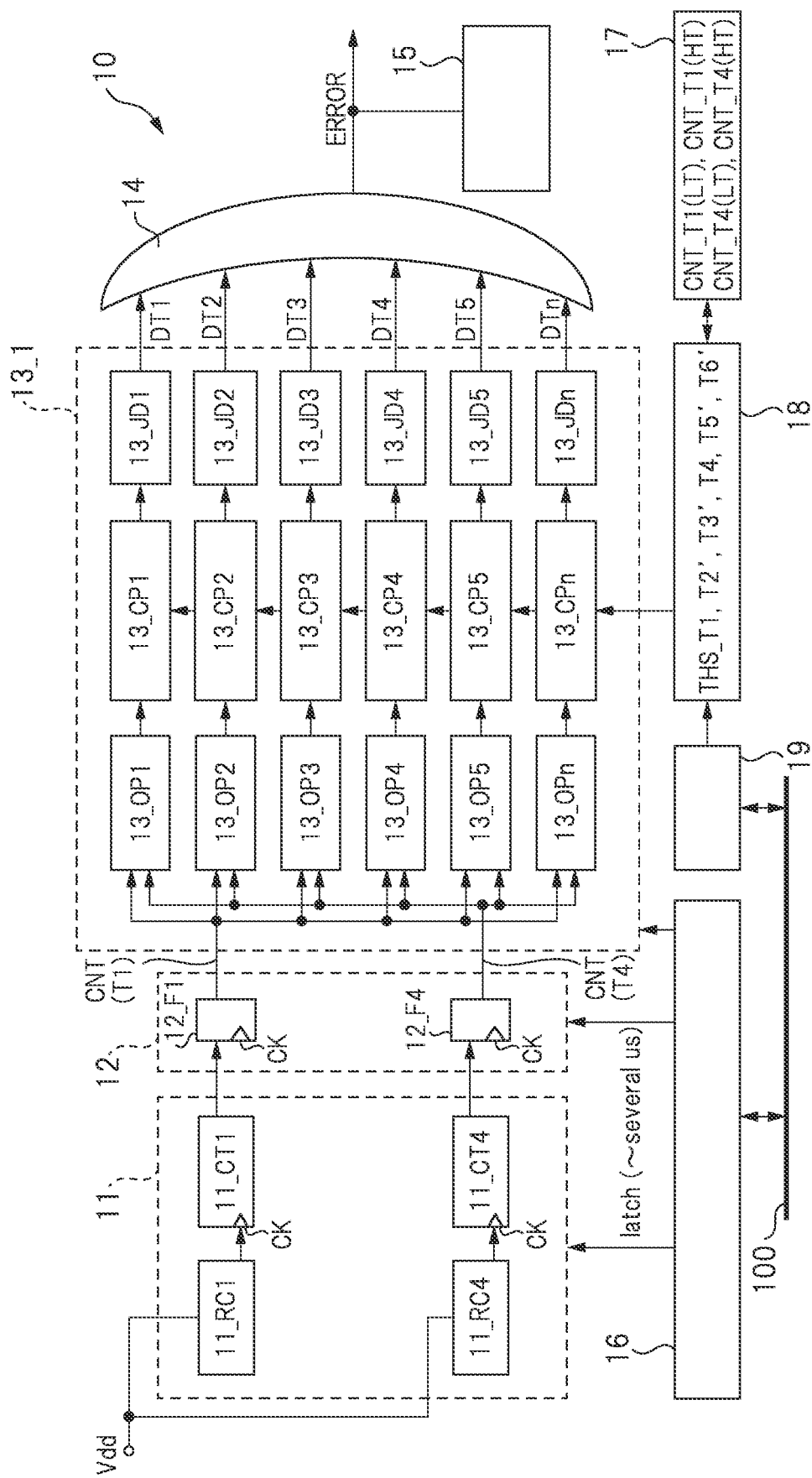
FIG. 6 is a block diagram illustrating a configuration of a semiconductor device according to a second embodiment.

FIG. 6 is a block diagram illustrating a configuration of the semiconductor device according to the second embodiment. Since FIG. 6 is similar to FIG. 1, differences thereof will mainly be described.

The differences are a point that an arithmetic unit 13_1 includes "n" arithmetic circuits 13_OP1 to 13_OPn, "n" comparators 13_CP1 to 13_CPn, and "n" determining devices 13_JD1 to 13_JDn, and a point that a voltage detecting circuit 10 includes a threshold value latch unit 13 and a calculation selection latch unit 19.

Count values CNT_T1(LT) and CNT_T4(LT) regarding oscillators 11_RC1 and a 11_RC4, which are obtained at the time of the low temperature trimming, are stored in a trimming latch unit 17. Further, count values CNT_T1(HT) and CNT_T4(HT) regarding the oscillators 11_RC1 and 11_RC4 which are obtained at the high temperature trimming, are also stored in the trimming latch unit 17.

Designation information for designating the calculation content to be executed by each of the arithmetic circuits 13_OP1 to 13_Opn is stored in the calculation selection latch unit 19 via. a bus 100. This designation information is supplied to each of the arithmetic circuits 13_OP1 to 13_OPn.

Count values CNT(T1) and CNT(T4) are supplied to each of the arithmetic circuits 13_OP1 to 13_OPn. Each of the arithmetic circuits 13_OP1 to 13_Opn executes calculation designated by the designation information for the count values CNT(T1) and CNT(T4), and a calculation result is supplied to corresponding one of the comparators 13_CP1 to 13_CPn as a calculation count value. Each of the arithmetic circuits 13_OP1 to 13_Opn is configured by an adder-subtractor (for example, ±CNT(T1)>>x, ±CNT (T4)>>y) in which a barrel shifter is added to an input side thereof, for example.

The count value obtained at the time of trimming is supplied to the threshold value latch unit 18 from the trimming latch unit 17. Further, although it is not limited particularly in this second embodiment, the designation information is supplied to the threshold value latch unit 18 from the calculation selection latch unit 19. Although it is not limited particularly in the second embodiment, calculation for the count value supplied from the trimming latch unit 17 is executed in the threshold value latch unit 18 on the basis of the calculation content designated by the designation information, and the threshold values are thereby calculated. Namely, the similar calculation to the calculation executed by the arithmetic circuits 13_OP1 to 13_Opn is executed by the threshold value latch unit 18, and the threshold values are thereby generated. Since generation of the threshold values may be executed before the detection operation is started, the threshold values may be generated by calculation of another circuit block in the semiconductor device 1, such as a processor, for example, instead of the threshold value latch unit 18.

A value determined by evaluation or a value according to a condition when a user uses it may be set to the calculation selection latch unit 19 as the designation information. Although FIG. 6 illustrates the example in which the "n" arithmetic circuits are used, the number of arithmetic circuits is arbitrary.

(Arithmetic Circuit and Threshold Value Latch Unit)

Figure 7:
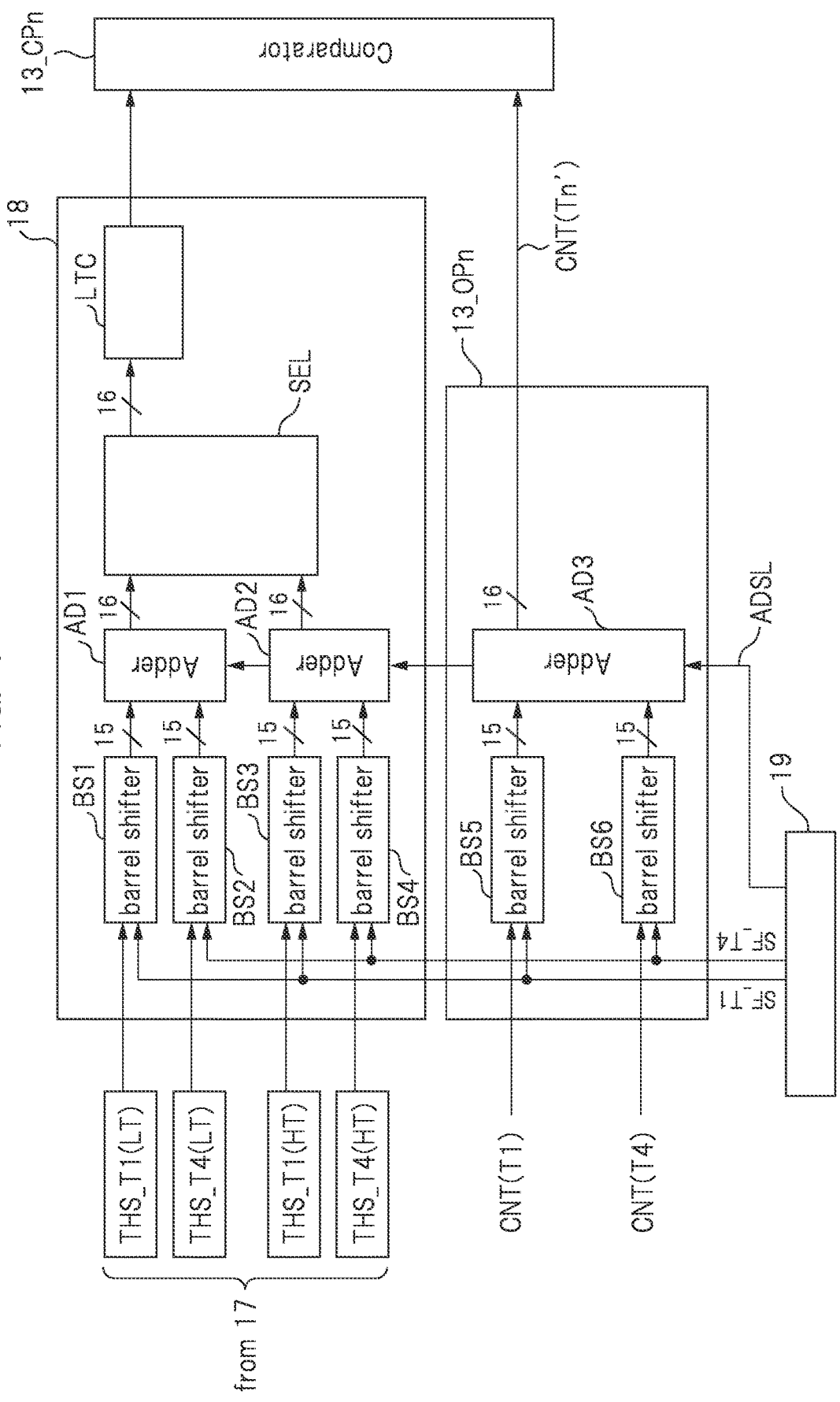
FIG. 7 is a block diagram illustrating one example of arithmetic circuits and a threshold value latch unit according to the second embodiment.

FIG. 7 is a block diagram illustrating one example of the arithmetic circuits and the threshold value latch unit according to the second embodiment. FIG. 7 illustrates the arithmetic circuit 13_OPn as an example, but each of the remaining arithmetic circuits also has the similar configuration.

The arithmetic circuit 13_Opn includes an adder-subtractor AD3, and barrel shifters BS5, BS6 provided on an input side of the adder-subtractor AD3. An addition/subtraction selection signal ADSL, a shift control signal SF_T1 corresponding to the count value CNT(T1), and a shift control signal SF_T4 corresponding to the count value CNT(T4) are outputted from the calculation selection latch unit 19 as the designation information. The count value CNT(T1) is supplied to the adder-subtractor AD3 via the barrel shifter BS5 controlled by the shift control signal SF_T1. Further, the count value CNT(T4) is supplied to the adder-subtractor AD3 via the barrel shifter BS6 controlled by the shift control signal SF_T4. The adder-subtractor AD3 executes addition or subtraction specified by the addition/subtraction selection signal ADSL for the count values supplied via the barrel shifters BS5, BS6, and outputs a calculation result to the corresponding comparator 13_CPn as a count value CNT (Tn').

The threshold value latch unit 18 includes adder-subtractors AD1, AD2, barrel shifters BS1 to BS4, a worst value selection circuit SEL, and a latch LTC. The barrel shifters BS1, BS2 respectively shift threshold values THS_T1(LT), THS_T4(LT) in accordance with the shift control signals SF_T1, SF_T4, and output them to the adder-subtractor AD1. Similarly, the barrel shifters BS3, BS4 respectively shift threshold values THS_T1(HT), THS_T4(HT) in accordance with the shift control signals SF_T1, SF_T4, and output them to the adder-subtractor AD2. The worst value selection circuit SEL selects one with the worse value from the count values outputted from the adder-subtractors AD1, AD2, and supplies the one to the latch LTC. An output of this latch LTC is supplied to the comparator 13_CPn as the threshold value. In the detection operation, the comparator 13_CPn compares the supplied threshold value with the count value CNT(Tn'); supplies a comparison result to the determining device 13_JDn; and outputs it as a detected result signal DTn.

A timing chart of the voltage detecting circuit 10 according to the second embodiment is similar to that of the voltage detecting circuit according to the first embodiment. Thus, explanation thereof will be omitted.

Figure 8:
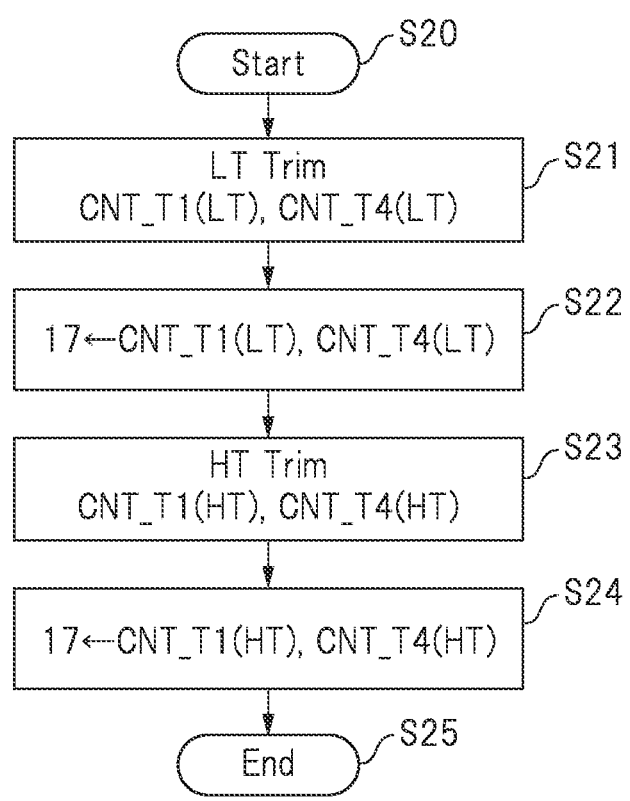
FIG. 8 is a flowchart diagram for explaining an operation at the time of trimming according to the second embodiment.

FIG. 8 is a flowchart diagram for explaining an operation at the time of the trimming according to the second embodiment. An operation of obtaining the count value is started at Step S20. At Step S21, at the time of the low temperature trimming, the count value CNT(T1) illustrated in FIG. 6 is obtained as the count value CNT_T1(LT) at the time of the low temperature, and the count value CNT(T4) is obtained as the count value CNT_T4(LT) at the time of the low temperature. These obtained count values CNT_T1(LT), CNT_T4(T4) are stored in the trimming latch unit 17 at Step S22. At next Step S23, at the time of the high temperature trimming, the count value CNT(T1) illustrated in FIG. 6 is obtained as the count value CNT_T1(HT) at the time of the high temperature, and the count value CNT(T4) is obtained as the count value CNT_T4(HT) at the time of the high temperature. These obtained count values CNT_T1(HT), CNT)_T4(HT) are stored in the trimming latch unit 17 at Step S24. Then, the processing is terminated at Step S25.

Before the detection operation is started, the threshold values are calculated on the basis of the count values stored in the trimming latch unit 17. The calculated threshold values are stored in the threshold value latch unit 18.

According to the second embodiment, it is possible to change the content of calculation. Therefore, the voltage detecting circuit 10 can be made programmable. As a result, for example, the calculation content can be selected in accordance with a target detected voltage. Therefore, further reduction of a temperature error can be expected.

Third Embodiment

In the first and second embodiments, the plurality of count values are obtained in parallel by the plurality of arithmetic circuits. On the other hand, in a third embodiment, one arithmetic circuit serially calculates a plurality of count values.

Figure 9:
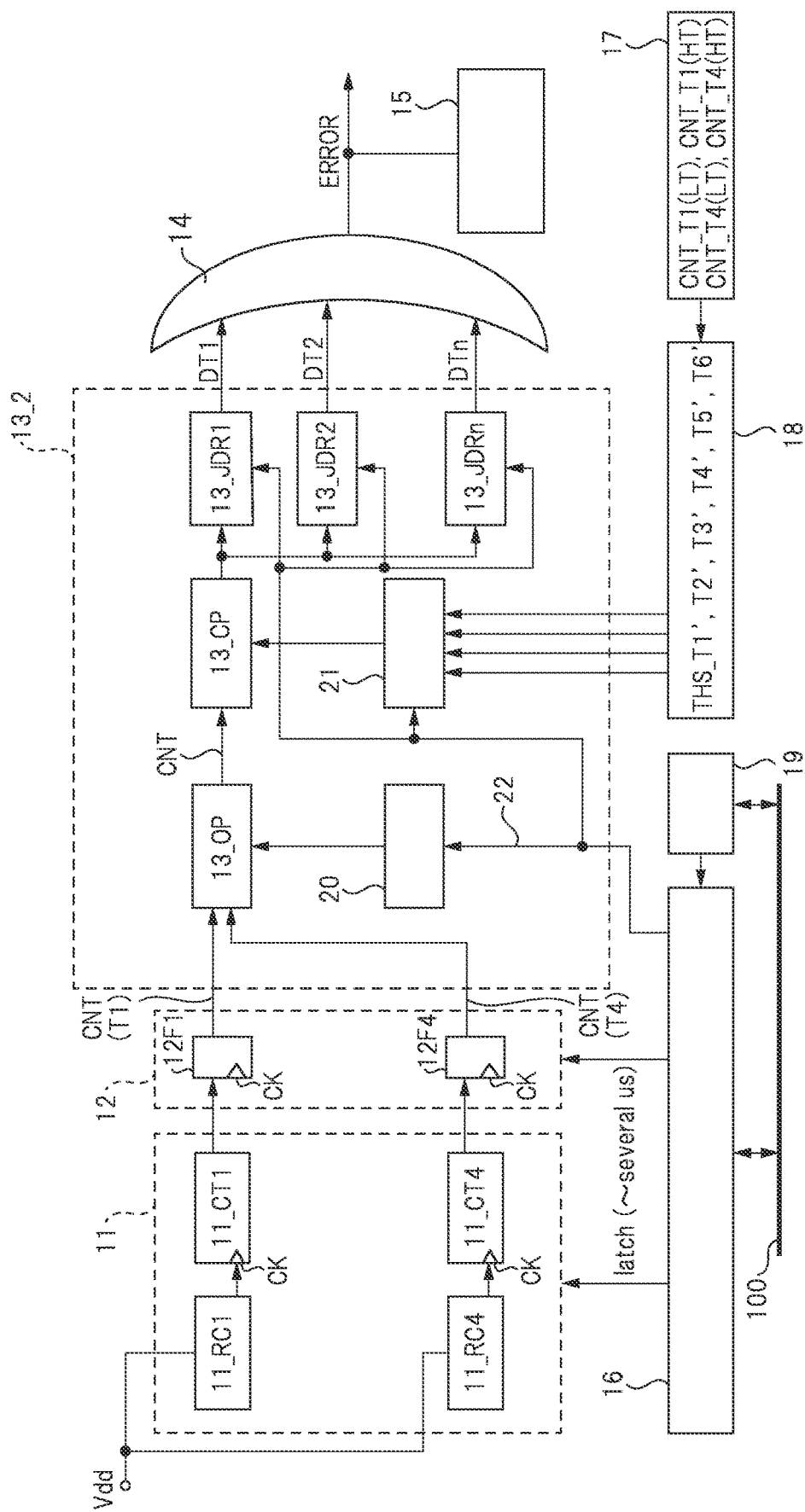
FIG. 9 is a block diagram illustrating a configuration of a semiconductor device according to a third embodiment.

FIG. 9 is a block diagram illustrating a configuration of a semiconductor device according to the third embodiment. Since FIG. 9 is similar to FIG. 6, differences will be described. A main difference is that the arithmetic unit is changed into an arithmetic unit 13_2.

The arithmetic unit 13_2 includes one common arithmetic circuit 13_OP, a calculation selection unit 20, one common comparator 13_CF, a selector 21, and determination registers 13_TDR1 to 13_JDRn.

Count values CNT(T1) and CNT(T4) are sequentially supplied to the arithmetic circuit 13_OP. The arithmetic circuit 13_OP executes calculation with the calculation content specified by the calculation selection unit 20 against the count values CNT(T1) and CNT(T4), and outputs a count value CNT. The calculation selection unit 20 specifies the different calculation content in a sequential order in accordance with an instruction signal 22 from the control unit 16. Threshold values are supplied to the selector 21 from a threshold value latch unit 18 in parallel. The selector 21 selects a threshold value from the plurality of threshold values thus supplied in accordance with the instruction signal 22, and supplies the selected threshold value to the comparator 13_CP. The comparator 13_CP compares the supplied count value CNT with a threshold value, and supplies a comparison result to each of the determination registers 13_JDR1 to 13_JDRn. Although it is not limited particularly, the instruction signal 22 is supplied to each of the determination registers 13_JDR1 to 13_JDRn. One determination register (for example, the determination register 13_JDR1) specified by the instruction signal 22 among the determination registers 13_JDR1 to 13_JDRn holds the comparison result supplied from the comparator 13_CP, and outputs a detected result signal (DT1) according to the held comparison result.

Figure 10:
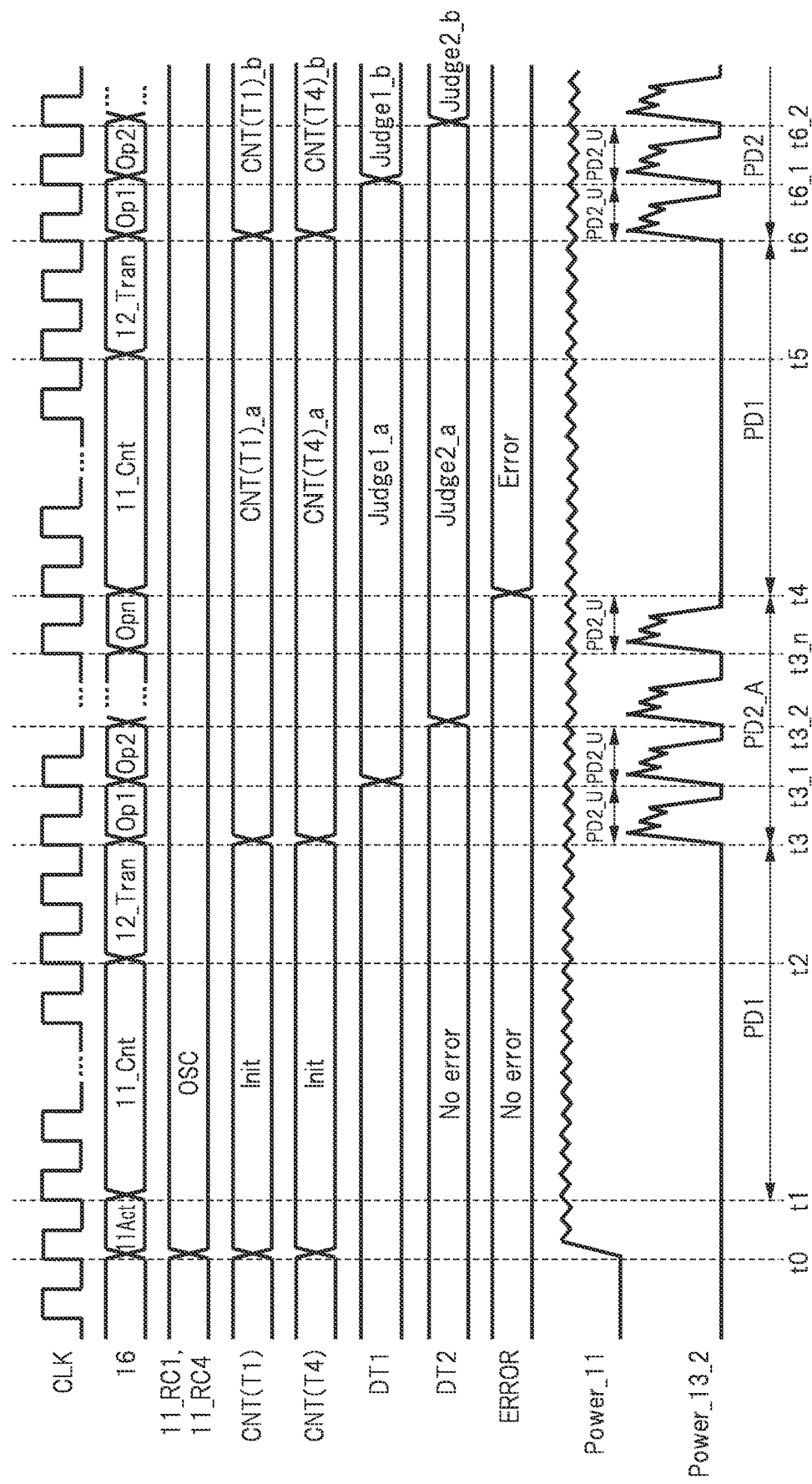
FIG. 10 is a timing chart diagram illustrating an operation of a voltage detecting circuit according to the third embodiment.

FIG. 10 is a timing chart diagram illustrating an operation of a voltage detecting circuit according to the third embodiment. Since FIG. 10 is similar to FIG. 2, differences will be mainly described. In FIG. 10, DT1 and DT2 indicate detected result signals. Here, although only the detected result signals DT1 and DT2 from the determination registers 13_JDR1, 13_JDR2 are illustrated in FIG. 10, the same applies to the other detected result signal. Further Power_13_2 indicates a change in power consumption of the arithmetic unit 13_2.

In FIG. 10, after asynchronous transfer 12_Tran is instructed, similarly to FIG. 2, the control unit 16 executes calculation, comparison, and determination against the arithmetic unit 13_2, but these calculation, comparison, and determination are executed serially. Namely, in FIG. 2, each of a plurality of calculations, a plurality of comparisons, and a plurality of determination is executed in parallel in the period PD2. However, in the third embodiment, a period PD A corresponding to the period PD2 is configured by a plurality of unit periods PD2_U, and one calculation, one comparison, and one determination are executed in each of the unit periods PD2_U. In this case, by means of the instruction signal 22, the calculation selection unit 20 selects the calculation content to be executed in the order from calculation Op1 to calculation Opn in a sequential order. Further, at this time, the selector is selected by the instruction signal 22 so that the threshold values corresponding to the calculations Op1 to Opn are selected. As a result, the comparator 13_CP compares each of calculation results supplied in a sequential order with the selected threshold value. Comparison results are stored and held in the order from the determination register 13_JDR1 to the determination register 13_JDRn, for example.

As illustrated in FIG. 10, a set of the count values CNT(T1), CNT(T4) is sequentially supplied to the arithmetic circuit 13_OP, and the arithmetic circuit 13_OP sequentially generates different calculation count values for one set of supplied count values. The calculation count values are sequentially supplied to the comparator 13_CP, and each of them is compared with the corresponding threshold value. Then, the determination registers respectively convert them into the detected result signals DT1 to DTn in parallel.

According to the third embodiment, although it is a trade-off with the power consumption, it is possible to reduce the occupied area thereof. This is because each of the arithmetic circuit and the comparator is shared.

Fourth Embodiment

Figure 11:
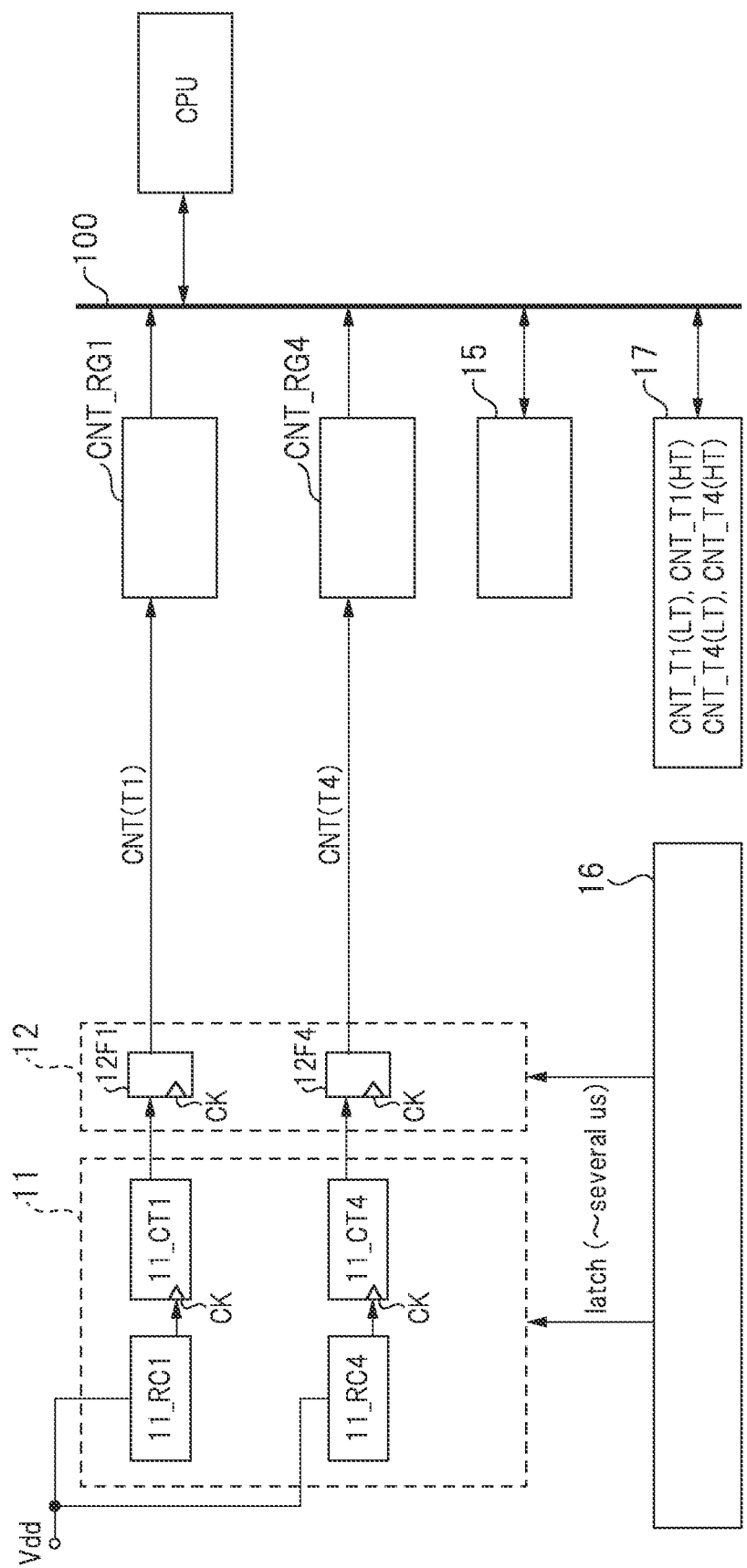
FIG. 11 is a block diagram illustrating a configuration of semiconductor device according to a fourth embodiment.

FIG. 11 is a block diagram illustrating a configuration of a semiconductor device according to a fourth embodiment. In FIG. 11, a sensor unit 11, an asynchronous transferring unit 12, and a trier ring latch unit 17 are the same as those illustrated in FIG. 6. In FIG. 11, CNT_RG1 and CNT_RG4 indicate count value holding registers (hereinafter, referred to also as "count registers"). The count register CNT_RG1 holds a count value CNT(T1), and the count register CNT_RG4 holds a count value CNT(T4). In the fourth embodiment, the count registers CNT_RG1, CNT_RG4, a flag register 15, a trimming latch unit 17, and a processor CPU are connected to a bus 100. Note that although it is not limited particularly, a control unit 16 is also connected to the bus 100.

The processor CPU reads out count values CNT_T1(LT), CNT_T1(HT) at the time of low temperature trimming and count values CNT_T4(LT), CNT_T4(HT) at the time of high temperature trimming, which are stored in the trimming latch unit 17, via the bus 100, and calculates threshold values as described in the second embodiment by calculation. Further, the processor CPU reads out the count values CNT(T1), CNT(T4) respectively stored in the counter registers CNT_RG1, CNT_RG4 via the bus 100, and calculates a plurality of count values as described in the second embodiment by calculation. Moreover, the processor CPU compares each of the calculated count value with a threshold value, and stores a comparison result in the flag register 15. The processor CPU executes such an operation whenever count values are respectively stored in the count registers CNT_RG1 and CNT_RG4.

According to the fourth embodiment, latency occurs in the calculation by the processor CPU, but it is possible to suppress an increase in hardware. Further, the calculation for calculating the count values and the threshold value can be modified arbitrarily, and this makes it possible to improve the degree of freedom thereof As described above, the invention made by inventors of the present application has been described specifically on the basis of the embodiments. However, the present invention is not limited to the embodiments described above, and it goes without saying that the present invention may be modified into various forms without departing from the substance thereof.

What is claimed is:

1. A semiconductor device comprising:
    a first oscillator configured to operate at a detected voltage, the first oscillator having first temperature dependency;
    a second oscillator configured to operate at the detected voltage, the second oscillator having second temperature dependency different from the first temperature dependency;
    a count unit configured to count an output of the first oscillator and an output of the second oscillator, the output of the first oscillator and the output of the second oscillator :being supplied to the count unit;
    an arithmetic unit configured to calculate a count value of the first oscillator and a count value of the second oscillator, the count values of the first and second oscilators being counted by the count unit; and
    a determining unit configured to compare an output of the arithmetic unit with a threshold value to output a detected result signal corresponding to a result of the comparison.

2. The semiconductor device according to claim 1, wherein the threshold value is set on a basis of an output of the count values of the first oscillator and the second oscillator in a low temperature state, and an output of the count values of the first oscillator and the second oscillator in a high temperature state in which temperature is higher than that in the low temperature state.

3. The semiconductor device according to claim 1, wherein content of the calculation by the arithmetic unit is variable.

4. The semiconductor device according to claim 1, wherein the count value of the first oscillator and the count value of the second oscillator are sequentially supplied to the arithmetic unit.

5. The semiconductor device according to claim 1, further comprising:
    a processor,
    wherein the arithmetic unit is configured by the processor.

6. The semiconductor device according to claim 1, wherein the arithmetic unit includes a first arithmetic circuit configured to obtain a value between the count value of the first counter and the count value of the second counter by interpolation.

7. The semiconductor device according to claim 1, wherein the arithmetic unit includes a second arithmetic circuit configured to obtain a value outside a range between the count value of the first counter and the count value of the second counter by extrapolation.

* * * * *